United States Patent
Tanabe

(10) Patent No.: US 10,027,285 B2
(45) Date of Patent: Jul. 17, 2018

(54) SEMICONDUCTOR DEVICE

(71) Applicant: Renesas Electronics Corporation, Koutou-ku, Tokyo (JP)

(72) Inventor: Yusuke Tanabe, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/397,803

(22) Filed: Jan. 4, 2017

(65) Prior Publication Data
US 2017/0194917 A1    Jul. 6, 2017

(30) Foreign Application Priority Data
Jan. 6, 2016 (JP) ................................. 2016-000883

(51) Int. Cl.
| | | |
|---|---|---|
| *H03F 1/02* | (2006.01) | |
| *H03F 1/30* | (2006.01) | |
| *H03M 1/38* | (2006.01) | |
| *H03F 3/00* | (2006.01) | |
| *H03F 3/45* | (2006.01) | |
| *H03M 1/46* | (2006.01) | |

(52) U.S. Cl.
CPC ............ *H03F 1/30* (2013.01); *H03F 3/45071* (2013.01); *H03M 1/38* (2013.01); *H03F 1/301* (2013.01); *H03F 1/303* (2013.01); *H03F 3/005* (2013.01); *H03F 3/45475* (2013.01); *H03F 2203/45101* (2013.01); *H03M 1/46* (2013.01)

(58) Field of Classification Search
CPC .......... H03F 1/30; H03F 3/45071; H03F 1/02; H03F 1/303; H03F 3/005; H03F 3/2178; H03M 1/38

USPC ...................................... 330/9; 327/124, 307
See application file for complete search history.

(56) References Cited

U.S. PATENT DOCUMENTS

| | | | |
|---|---|---|---|
| 6,459,335 B1 * | 10/2002 | Darmawaskita .... | H03F 3/45977 330/9 |
| 7,265,611 B2 * | 9/2007 | Wang .................. | H03F 3/45753 330/9 |
| 7,459,966 B2 | 12/2008 | Nakao | |

(Continued)

FOREIGN PATENT DOCUMENTS

JP        2006-311350 A     11/2006

*Primary Examiner* — Khanh V Nguyen
(74) *Attorney, Agent, or Firm* — Sughrue Mion, PLLC

(57) ABSTRACT

In a semiconductor device according to related art, it is impossible to sufficiently correct an input offset of an operational amplifier. According to one embodiment, a semiconductor device calculates, when a voltage level of an output signal output in a state in which an input of the operational amplifier is short-circuited is determined, a correction code that adjusts the input offset of the operational amplifier based on a voltage level of an output signal determined based on a comparator circuit in a period during which the input offset is large and an output of the operational amplifier is close to a power supply voltage level or a ground voltage level and a correction code that adjusts the input offset of the operational amplifier based on a voltage level of an output signal determined based on an analog-to-digital conversion circuit in a period during which the input offset is small and the output of the operational amplifier is in an intermediate level between the power supply voltage and the ground voltage.

12 Claims, 11 Drawing Sheets

(56) References Cited

U.S. PATENT DOCUMENTS

| | | | | |
|---|---|---|---|---|
| 7,659,777 B2 * | 2/2010 | Fujino | ................ | H03F 3/45183 |
| | | | | 330/9 |
| 7,701,282 B2 * | 4/2010 | Matsuoka | ........... | H03F 3/45179 |
| | | | | 330/9 |
| 8,531,239 B2 * | 9/2013 | Yamazaki | ........... | H03F 3/45475 |
| | | | | 327/307 |

* cited by examiner

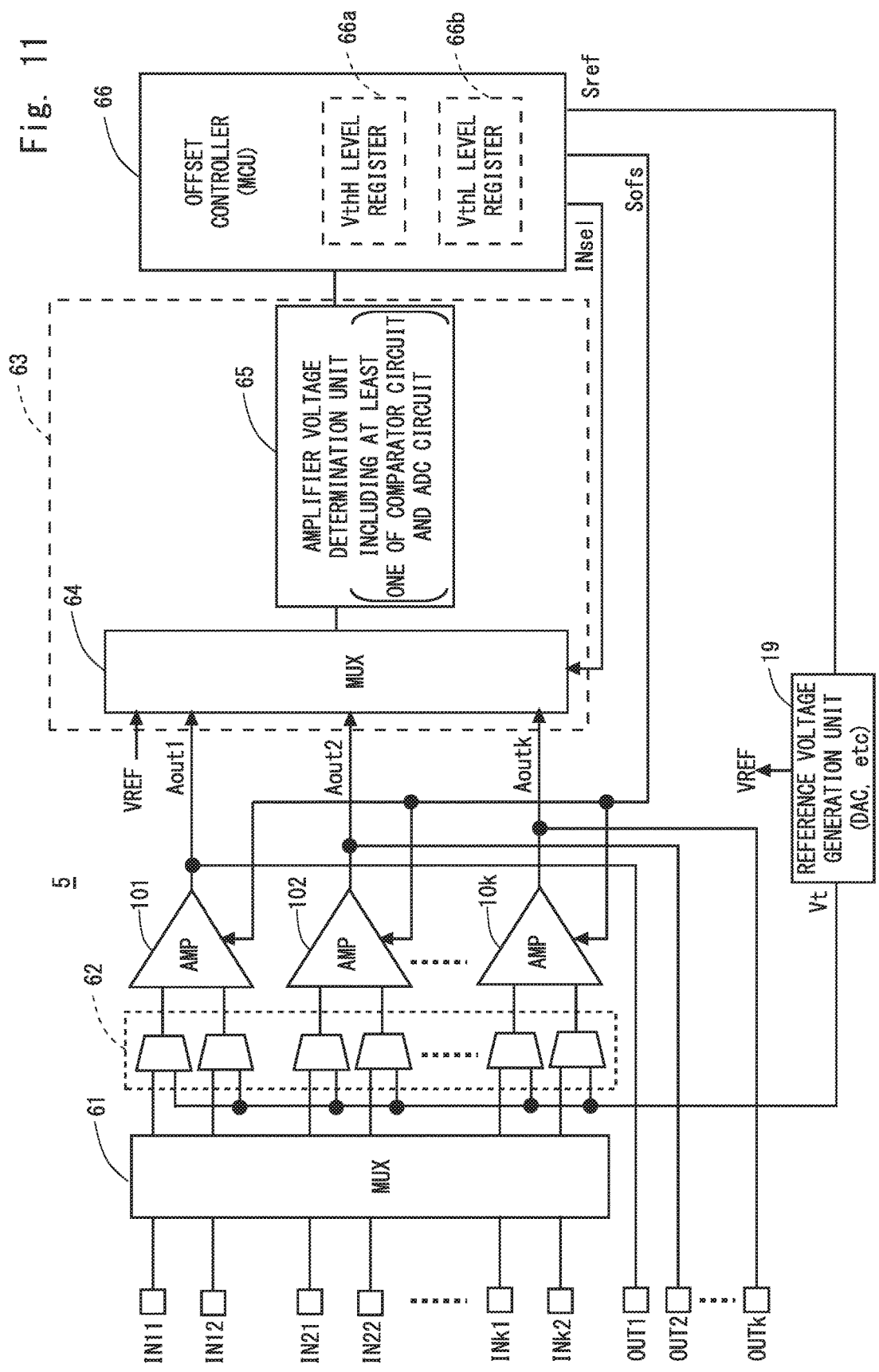

SEMICONDUCTOR DEVICE

CROSS-REFERENCE TO RELATED APPLICATIONS

This application is based upon and claims the benefit of priority from Japanese patent application No. 2016-000883, filed on Jan. 6, 2016, the disclosure of which is incorporated herein in its entirety by reference.

BACKGROUND

The present invention relates to a semiconductor device and relates to, for example, a semiconductor device that includes an operational amplifier.

An input offset, which is a difference between a threshold voltage of an inverting input terminal and a threshold voltage of a non-inverting input terminal due to variations or the like of semiconductor elements during a manufacturing process, occurs in an operational amplifier. It is required to minimize this input offset since the input offset causes an error in results of amplification when minute signals are amplified. However, a modification of only the manufacturing process is not enough to reduce the input offset. Japanese Unexamined Patent Application Publication No. 2006-311350 discloses a method of correcting the input offset.

The configuration disclosed in Japanese Unexamined Patent Application Publication No. 2006-311350 includes an operational amplifier that includes an offset adjustment input terminal, a first switching element for short-circuiting a non-inverting input terminal and an inverting input terminal of the operational amplifier, a second switching element for disconnecting the inverting input terminal of the operational amplifier from a negative-phase input signal, one or more latch circuits that regard an output voltage of the operational amplifier as a binary logical signal formed of a logical value quantized by a weighted offset adjustment amount and latch the output voltage, a storage circuit that stores the logical signal that has been latched by the latch circuit(s), and a control circuit that generates an offset adjustment signal of the operational amplifier in accordance with the logical signal stored in the storage circuit and outputs the offset adjustment signal to the offset adjustment input terminal, whereby the offset of the output voltage is corrected.

SUMMARY

However, in Japanese Unexamined Patent Application Publication No. 2006-311350, the latch circuit is used for determining the voltage level of the output voltage of the operational amplifier. There is a dead zone in which the logic level of the output signal becomes unstable in the latch circuit. Therefore, in the technique disclosed in Japanese Unexamined Patent Application Publication No. 2006-311350, when the output voltage of the operational amplifier becomes an intermediate voltage between the power supply voltage and the ground voltage, the input offset cannot be sufficiently reduced due to the dead zone of the latch circuit.

The other problems of the related art and the novel characteristics of the present invention will be made apparent from the descriptions of the specification and the accompanying drawings.

According to one embodiment, a semiconductor device calculates, when a voltage level of an output signal output in a state in which an input of an operational amplifier is short-circuited is determined, correction code that adjusts an input offset of the operational amplifier based on a voltage level of an output signal determined based on a comparator circuit in a period during which the input offset is large and an output of the operational amplifier is close to a power supply voltage level or a ground voltage level and a correction code that adjusts the input offset of the operational amplifier based on a voltage level of an output signal determined based on an analog-to-digital conversion circuit in a period during which the input offset is small and the output of the operational amplifier is in an intermediate level between the power supply voltage and the ground voltage.

According the embodiment, it is possible to improve the correction accuracy of the input offset of the operational amplifier.

BRIEF DESCRIPTION OF THE DRAWINGS

The above and other aspects, advantages and features will be more apparent from the following description of certain embodiments taken in conjunction with the accompanying drawings, in which:

FIG. 11 is a block diagram of a semiconductor device according to a fifth embodiment.

DETAILED DESCRIPTION

First Embodiment

For the clarification of the description, the following description and the drawings may be omitted or simplified as appropriate. Throughout the drawings, the same components are denoted by the same reference symbols and overlapping descriptions will be omitted as appropriate.

In the following description, an operation unit (e.g., offset controller) may be formed of a CPU, a memory, an MCU, or another circuit and specific processing in the operation unit is assumed to be implemented by a program or the like loaded in a memory. However, the processing performed in the operation unit may instead be achieved by hardware.

A (The) program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

Figure 1:
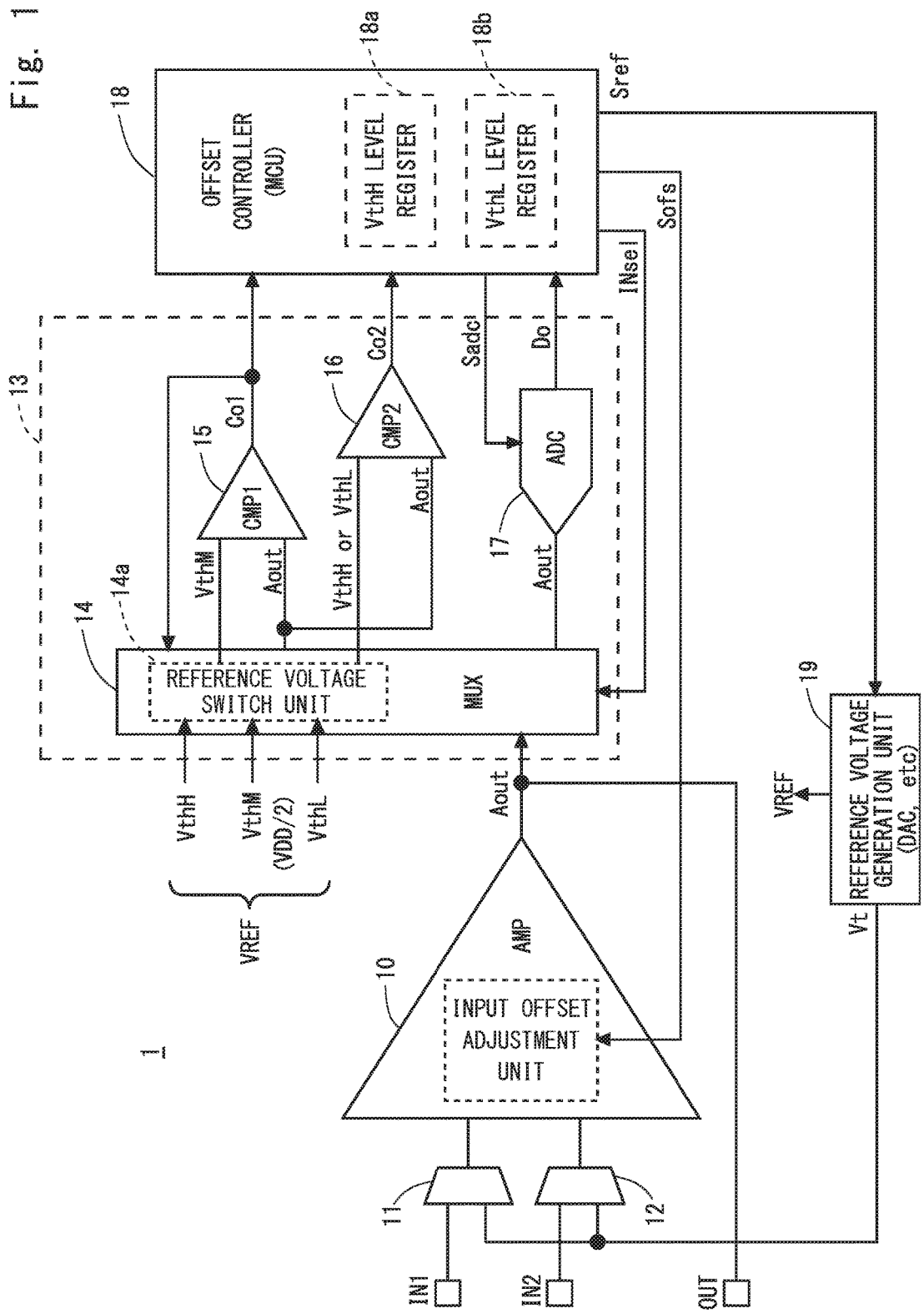
FIG. 1 is a block diagram of a semiconductor device according to a first embodiment.

FIG. 1 shows a block diagram of a semiconductor device 1 according to a first embodiment. As shown in FIG. 1, the semiconductor device 1 according to the first embodiment includes an operational amplifier 10, input selectors 11 and 12, an output determination unit 13, an offset controller 18, and a reference voltage generation unit 19. Further, the semiconductor device 1 includes input/output terminals of the operational amplifier 10 provided as external terminals of the semiconductor device. In the example shown in FIG. 1, an input terminal IN1 is one input terminal of the operational amplifier 10, an output terminal IN2 is another input terminal of the operational amplifier 10, and an output terminal OUT is an output terminal of the operational amplifier 10.

The operational amplifier 10 includes an offset adjustment function that mitigates an influence of an input offset based on a multi-bit correction code and an amplification function that amplifies an input signal and outputs the amplified signal. As shown in FIG. 1, the operational amplifier 10 includes an input offset adjustment unit as a circuit that achieves the offset adjustment function. The operational amplifier 10 includes a differential pair that serves as an input unit of the operational amplifier 10 and a current source that supplies an operating current to the differential pair. A node in which the current source is connected to the differential pair is called a common node. The input offset adjustment unit varies, for example, a ratio of a resistance value between the common node and one transistor of the differential pair to a resistance value between the common node and the other transistor or the differential pair, to thereby adjust the magnitude of the input offset. Further, the input offset adjustment unit adjusts the ratio of the current that flows through the source (or the emitter) of one of the transistors that forms the differential pair to the current that flows through the source (or the emitter) of the other one of the transistors that forms the differential pair, to thereby adjust the magnitude of the input offset. The circuit configuration of the input offset adjustment unit may vary depending on the circuit form of the operational amplifier 10. In this embodiment, the input offset adjustment unit is able to adjust the magnitude of the input offset based on a value indicated by a correction code Sofs.

The input selectors 11 and 12 select one of input signals input from outside and a test voltage Vt output from the reference voltage generation unit 19 based on a selection signal output from the offset controller 18 and supplies the selected signal to the input terminal of the operational amplifier 10. In FIG. 1, lines related to the selection signal that the offset controller 18 supplies to the input selectors 11 and 12 are omitted.

The output determination unit 13 outputs a digital value in accordance with the magnitude of the voltage level of an output signal of the operational amplifier 10 as an output determination value. In the example shown in FIG. 1, the output determination value includes an output value Co1 output from a multiplexer 14 and a comparator circuit 15, an output value Co2 output from a comparator circuit 16, and a digital code Do output from an analog-to-digital conversion circuit 17.

The output determination unit 13 includes the multiplexer 14, first comparator circuit (e.g., the comparator circuit 15), a second comparator circuit (e.g., the comparator circuit 16), and the analog-to-digital conversion circuit 17.

The multiplexer 14 assigns an output signal Aout of the operational amplifier 10 to the comparator circuit (e.g., comparator circuits 15 and 16) and the analog-to-digital conversion circuit 17. Further, the multiplexer 14 includes a reference voltage switch unit 14a. The reference voltage switch unit 14a receives a first reference voltage (e.g., reference voltage VthM), a second reference voltage (e.g., upper-limit reference voltage VthH) having a voltage value higher than that of the reference voltage VthM, and a third reference voltage (e.g., lower-limit reference voltage VthL) having a voltage value lower than that of the reference voltage VthM, and switches the reference voltage to be output to the comparator circuit 16 based on the output value Co1 of the comparator circuit 15. Specifically, the reference voltage switch unit 14a outputs the reference voltage VthM to the comparator circuit 15. When the output value Co1 of the comparator circuit 15 indicates a first logic level (e.g., power supply voltage, which is a high level), the reference voltage switch unit 14a outputs the reference voltage VthH to the comparator circuit 16 and when the output value Co1 of the comparator circuit 15 indicates a second logic level (e.g., ground voltage, which is a low level), the reference voltage switch unit 14a outputs the reference voltage VthL to the comparator circuit 16.

The comparator circuit 15 compares the respective magnitudes of the output signal Aout of the operational amplifier 10 and the reference voltage VthM and switches the logic level of the output value Co1. Specifically, when the voltage of the output signal Aout is larger than that of the reference voltage VthM, the comparator circuit 15 sets the output value Co1 to the high level and when the voltage of the output signal Aout is smaller than that of the reference voltage VthM, the comparator circuit 15 sets the output value Co1 to the low level. In the semiconductor device 1 according to the first embodiment, the reference voltage VthM is a voltage about ½ of the power supply voltage (VDD/2).

The comparator circuit 16 compares the respective magnitudes of one of the reference voltage VthH and the reference voltage VthL and the output signal Aout of the operational amplifier 10 and switches the logic level of the output value Co2. Specifically, when the voltage of the output signal Aout is larger than that of the reference voltage VthH or the reference voltage VthL, the comparator circuit 16 sets the output value Co2 to the high level and when the voltage of the output signal Aout is smaller than that of the reference voltage VthH or the reference voltage VthL, the comparator circuit 16 sets the output value Co2 to the low level. In the semiconductor device 1 according to the first embodiment, the reference voltage VthH has a voltage value about 0.2 V lower than that of the power supply voltage and the reference voltage VthL has a voltage value about 0.2 V higher than the ground voltage. The value 0.2 V, which is indicated as the difference between the reference voltage VthH and the power supply voltage and the difference between the reference voltage VthL and the ground voltage, is one example of a voltage set value and is appropriately set based on conditions such as the gain of the comparator circuit, the resolution of the analog-to-digital conversion circuit 17, the voltage of the power supply voltage and the like.

The analog-to-digital conversion circuit 17 outputs the digital code Do indicating the value corresponding to the voltage level of the output signal Aout of the operational amplifier 10 as an output determination value in a number of bits larger than that of output determination values output from the comparator circuits 15 and 16 (e.g., output values Co1 and Co2). Further, the analog-to-digital convers on circuit 17 performs analog-to-digital conversion processing that converts an analog signal into the digital code Do based on an ADC control signal Sadc output from the offset controller 18.

In the output determination unit 13, the number of bits of the output determination values output from the comparator circuits 15 and 16 is two bits (e.g., output values Co1 and Co2) and the number of bits of the digital code Do output from the analog-to-digital conversion circuit 17 is larger (e.g., 10 bits) than that of the output determination values output from the comparator circuits 15 and 16.

The offset controller 18 calculates a correction code Sofs based on the output determination value of the output determination unit 13. At the time of calculation of the correction code Sofs, when the voltage level of the output signal Aout of the operational amplifier 10 is outside of a fine adjustment range that has been set in advance, the offset controller 18 calculates the correction code Sofs based on the number of bits smaller than that when the voltage level of the output signal of the operational amplifier 10 is within the fine adjustment range.

Specifically, when the voltage level of the output signal Aout of the operational amplifier 10 is outside of the fine adjustment range, the offset controller 18 calculates the correction Code Sofs based on the output determination values (e.g., output values Co1 and Co2) output from the comparator circuits 15 and 16. Further, when the voltage level of the output signal Aout of the operational amplifier 10 is within the fine adjustment range, the offset controller 18 calculates the correction code based on the output determination value (e.g., digital code Do) output from the analog-to-digital conversion circuit 17. This offset controller 18 is, for example, an operation unit such as a micro controller unit (MCU) including an operation apparatus capable of executing the program.

Further, the offset controller 18 includes a first register VthH level register 18a) and a second register (e.g., VthL level register 18b). The VthH level register 18a stores a voltage value of the upper-limit reference voltage VthH corresponding to the upper-limit voltage level of the fine adjustment range. The VthL level register 18b stores a voltage value of the lower-limit reference voltage VthL corresponding to the lower-limit voltage level of the fine adjustment range. The values stored in the VthH level register 18a and the VthL level register 18b can be rewritten from outside of the semiconductor device 1. The offset controller 18 outputs a value indicating the voltage value stored in the VthH level register 18a, the voltage value stored in the VthL level register 18b, and the voltage value of a test voltage Vt (described later) as a voltage indication value Sref.

Further, the offset controller 18 outputs a determination circuit selection signal INsel that indicates whether the multiplexer 14 outputs the output voltage Aout of the operational amplifier 10 to the comparator circuits 15 and 16 or to the analog-to-digital conversion circuit 17. The multiplexer 14 outputs the output signal Aout to one of the pair of the comparator circuits 15 and 16 and the analog-to-digital conversion circuit 17 based on the determination circuit selection signal INsel.

It is also possible to omit the components other than the reference voltage switch unit 14a of the multiplexer 14 and constantly supply the output signal Aout to both the pair of the comparator circuits 15 and 16 and the analog-to-digital conversion circuit 17. In this case, however, when the output signal Aout becomes close to the reference voltage to be input to the comparator circuits 15 and 16, the output values Co1 and Co2 of the comparator circuits 15 and 16 may become unstable and the offset controller 18 may malfunction. Accordingly, it is preferable to provide the multiplexer 14 to supply a high-level or low-level signal in place of the output signal Aout to one of the pair of the comparator circuits 15 and 16 and the analog-to-digital conversion circuit 17 that is not performing determination processing.

The reference voltage generation unit 19 generates, based on the voltage indication value Sref output from the offset controller 18, a reference voltage VREF and the test voltage Vt. The voltage value of the test voltage Vt is determined based on the value that indicates the voltage value of the test voltage Vt included in the voltage indication value Sref and the test voltage Vt has a voltage, for example, of about ½ of the power supply voltage. Further, the reference voltage VREF includes the reference voltage VthM, the upper-limit reference voltage VthH, and the lower-limit reference voltage VthL. The reference voltage VthM is a voltage generated by the reference voltage generation unit 19 based on, for example, a value that has been set in advance, and has a voltage, for example, of about ½ of the power supply voltage. The upper limit reference voltage VthH is a voltage generated by the reference voltage generation unit 19 based on the value stored in the VthH level register 18a. The lower-limit reference voltage VthL is a voltage generated by the reference voltage generation unit 19 based on the value stored in the VthL level register 18b.

Figure 2:
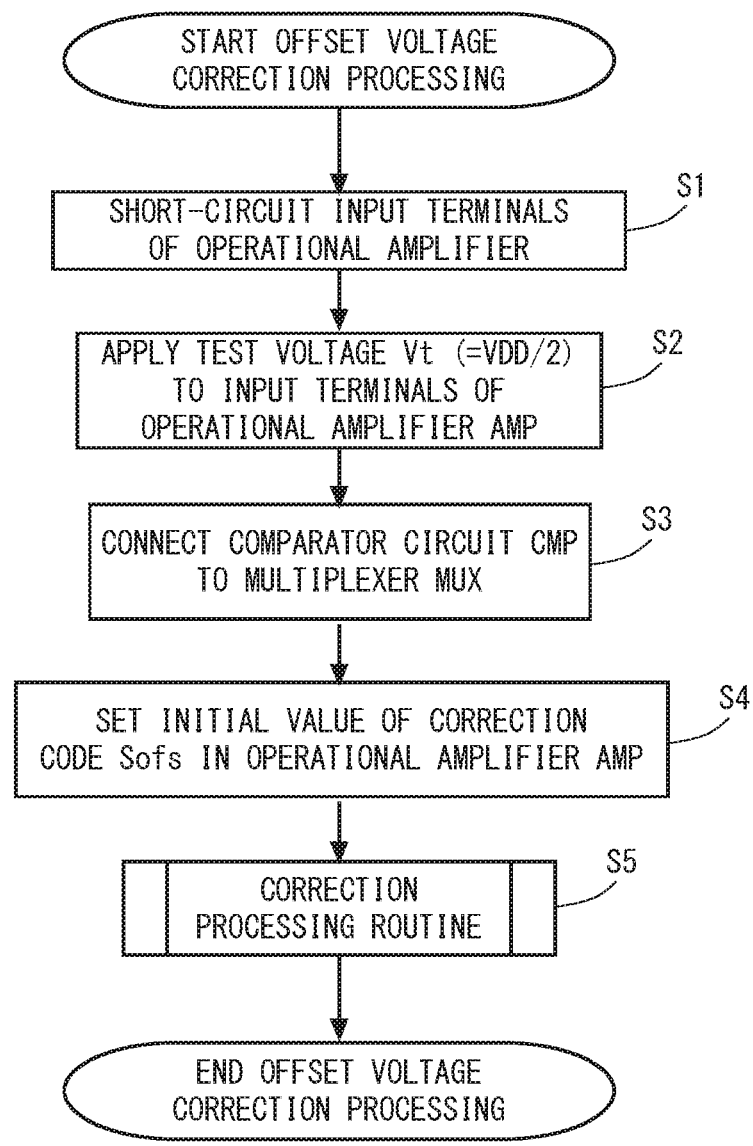
FIG. 2 is a flowchart showing a procedure of offset voltage correction processing in the semiconductor device according to the first embodiment.
Figure 3:
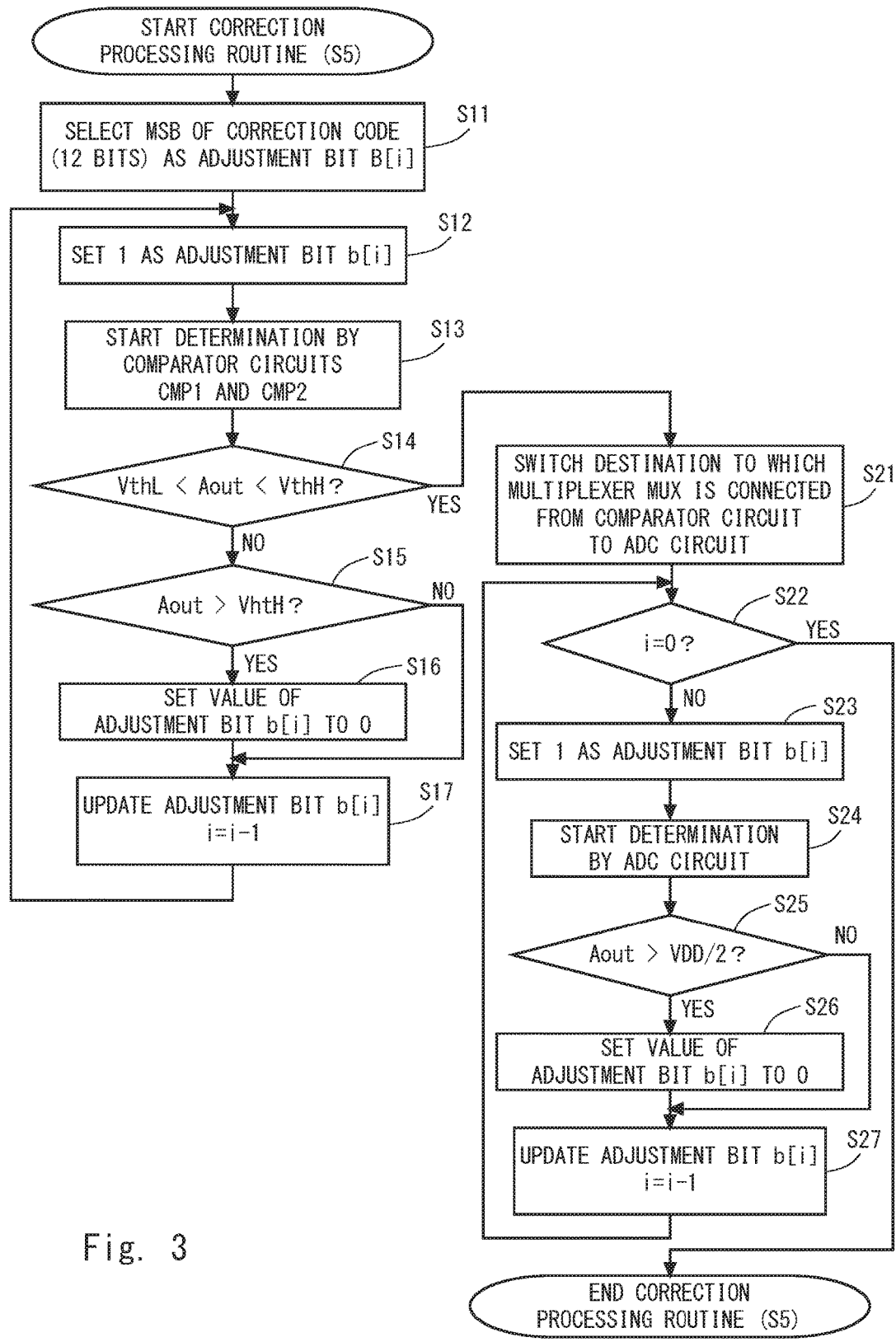
FIG. 3 is a flowchart showing a procedure of a correction processing routine in the flowchart shown in FIG. 2.

Referring next to FIGS. 2 and 3, operations of the semiconductor device 1 according to the first embodiment will be described. In the semiconductor device 1 according to the first embodiment, the offset controller 18 controls the blocks other than the offset controller 18, whereby the semiconductor device 1 performs offset voltage correction processing shown in FIGS. 2 and 3. FIG. 2 shows a flowchart showing a procedure of the offset voltage correction processing in the semiconductor device according to the first embodiment.

As shown in FIG. 2, when the semiconductor device 1 according to the first embodiment starts the offset voltage correction processing that corrects the input offset of the operational amplifier 10, the semiconductor device 1 first short-circuits the input terminals of the operational amplifier 10 (Step S1). The method of short-circuiting the input terminals of the operational amplifier 10 includes a method of short-circuiting the input terminal IN1 and the input terminal IN2 of the semiconductor device 1 and a method of short-circuiting the input terminals of the operational amplifier 10 by the input selectors 11 and 12 in the semiconductor device 1. The semiconductor device 1 according to the first embodiment causes both of the input selectors 11 and 12 to select the test voltage Vt, whereby the input terminals of the operational amplifier 10 are short-circuited. Further, in the semiconductor device 1 according to the first embodiment, the test voltage Vt is supplied to the two input terminals of the operational amplifier 10 in a state in which the input terminals of the operational amplifier 10 are short-circuited (Step S2).

Next, in the semiconductor device 1 according to the first embodiment, the offset controller 18 causes the multiplexer 14 to supply the output signal Aout to the comparator circuits 15 and 16 (Step S3). Further, the semiconductor device 1 according to the first embodiment supplies an initial value of the correction code Sofs (e.g., a value in which all the bits are set to "0") to the operational amplifier 10 (Step S4). After that, the semiconductor device 1 according to the first embodiment executes the correction processing routine (Step S5).

FIG. 3 shows a flowchart showing the procedure of the correction processing routine. In the example shown in FIG. 3, the correction processing routine that determines the value of the correction code Sofs formed of 12 bits will be described. In FIG. 3, "i" is used as a sign that indicates the number of the bits that form the correction code.

As shown in FIG. 3, the semiconductor device 1 according to the first embodiment selects the most significant bit (MSB) of the correction code Sofs as an adjustment bit b[i] (Step S11). Next, the semiconductor device 1 according to the first embodiment sets "1" as the value of the adjustment bit b[i] (Step S12). Then the semiconductor device 1 according to the first embodiment starts processing for determining the voltage level of the output signal Aout by the comparator circuits 15 and 16 (Step S13).

When it is determined in the determination processing in Step S13 that the voltage level of the output signal Aout is outside of the fine adjustment range determined by the upper-limit reference voltage VthH and the lower-limit reference voltage VthL (NO in Step S14), it is determined whether the voltage level of the output signal Aout is higher than the upper-limit reference voltage VthH (Step S15). When the voltage level of the output signal Aout is higher than the upper-limit reference voltage VthH, the semiconductor device 1 according to the first embodiment sets the value of the adjustment bit b[i] to "0" (Step S16). On the other hand, when the voltage level of the output signal Aout is equal to or lower than the upper-limit reference voltage VthH, the semiconductor device 1 keeps the value of the adjustment bit b[i] to "1" (NO in Step S15). Then the semiconductor device 1 according to the first embodiment decrements the bit to be selected as the adjustment bit by one and updates the adjustment bit b[i] (Step S17). After the update processing in Step S17 is completed, the processes from Steps S12 to S17 are repeated.

On the other hand, when it is determined in Step S14 that the voltage level of the output signal Aout is within the fine adjustment range determined by the upper-limit reference voltage VthH and the lower-limit reference voltage VthL (YES in Step S14), in the semiconductor device 1 according to the first embodiment, the offset controller 18 instructs the multiplexer 14 to switch the destination to which the output signal Aout is to be output to the analog-to-digital conversion circuit 17 (Step S21).

Next, the semiconductor device 1 according to the first embodiment determines whether the bit number i of the adjustment bit is "0" (Step S22). When the bit number i is "0" in the determination processing in Step S22, the semiconductor device 1 according to the first embodiment ends the correction processing routine and the offset voltage correction processing. On the other hand, when the bit number i is a value other than "0" in the determination processing in Step S22, the semiconductor device 1 according to the first embodiment sets "1" as the value of the adjustment bit b[i] (Step S23). After that, the semiconductor device 1 according to the first embodiment starts processing for determining the voltage level of the output signal Aout based on the output correction value (e.g., digital code Do) output from the analog-to-digital conversion circuit 17 (Step S24).

In this determination processing, it is determined whether the voltage level of the output signal Aout is higher than that of the reference voltage VthM (=VDD/2) (Step S25). When it is determined in Step S25 that the voltage level of the output signal Aout is higher than that of the reference voltage VthM, the semiconductor device 1 according to the first embodiment sets the value of the adjustment bit b[i] to "0" (Step S26). On the other hand, when it is determined in Step S25 that the voltage level of the output signal Aout is equal to or smaller than that of the reference voltage VthM, the semiconductor device 1 according to the first embodiment keeps the value of the adjustment bit b[i] to "1". Then the semiconductor device 1 according to the first embodiment decrements the bit to be selected as the adjustment bit by one and updates the adjustment bit b[i] (Step S27). After the update processing in Step S27 is completed, the processes of Steps S22 to S27 are repeated.

The determination processing in Steps S14 and S15 will be described in detail. In the semiconductor device 1 according to the first embodiment, in a period during which the output signal Aout of the operational amplifier 10 is outside of the fine adjustment range, the offset controller 18 calculates the value of the adjustment bit b[i] of the correction code based on the values of the output values Co1 and Co2 of the comparator circuits 15 and 16. Specifically, when the output signal Aout of the operational amplifier 10 is outside of the fine adjustment range, the offset controller 18 determines the signal level of the output signal Aout as follows based on the values of the output values Co1 and Co2 of the comparator circuits 15 and 16. The offset controller 18 determines, when the output value Co1 of the comparator circuit 15 is at the high level and the output value Co2 of the comparator circuit 16 is at the low level or when the output value Co1 of the comparator circuit 15 is at the low level and the output value Co2 of the comparator circuit 16 is at the high level, that the output signal Aout is within the fine adjustment range. On the other hand, the offset controller 18 determines, when the output value Co1 of the comparator circuit 15 is at the high level and the output value Co2 of the comparator circuit 16 is at the high level or when the output value Co1 of the comparator circuit 15 is at the low level and the output value Co2 of the comparator circuit 16 is at the low level, that the output signal Aout is outside of the fine adjustment range.

Further, the offset controller 18 of the semiconductor device 1 according to the first embodiment performs the following processing when the value of the adjustment bit b[i] of the correction code is calculated based on the code Do output from the analog-to-digital conversion circuit 17 (e.g., Steps S24 and S25). The offset controller 18 determines whether the value of the voltage level of the output signal Aout indicated by the bits of the digital code Do is larger than that of the reference voltage VthM.

Figure 4:
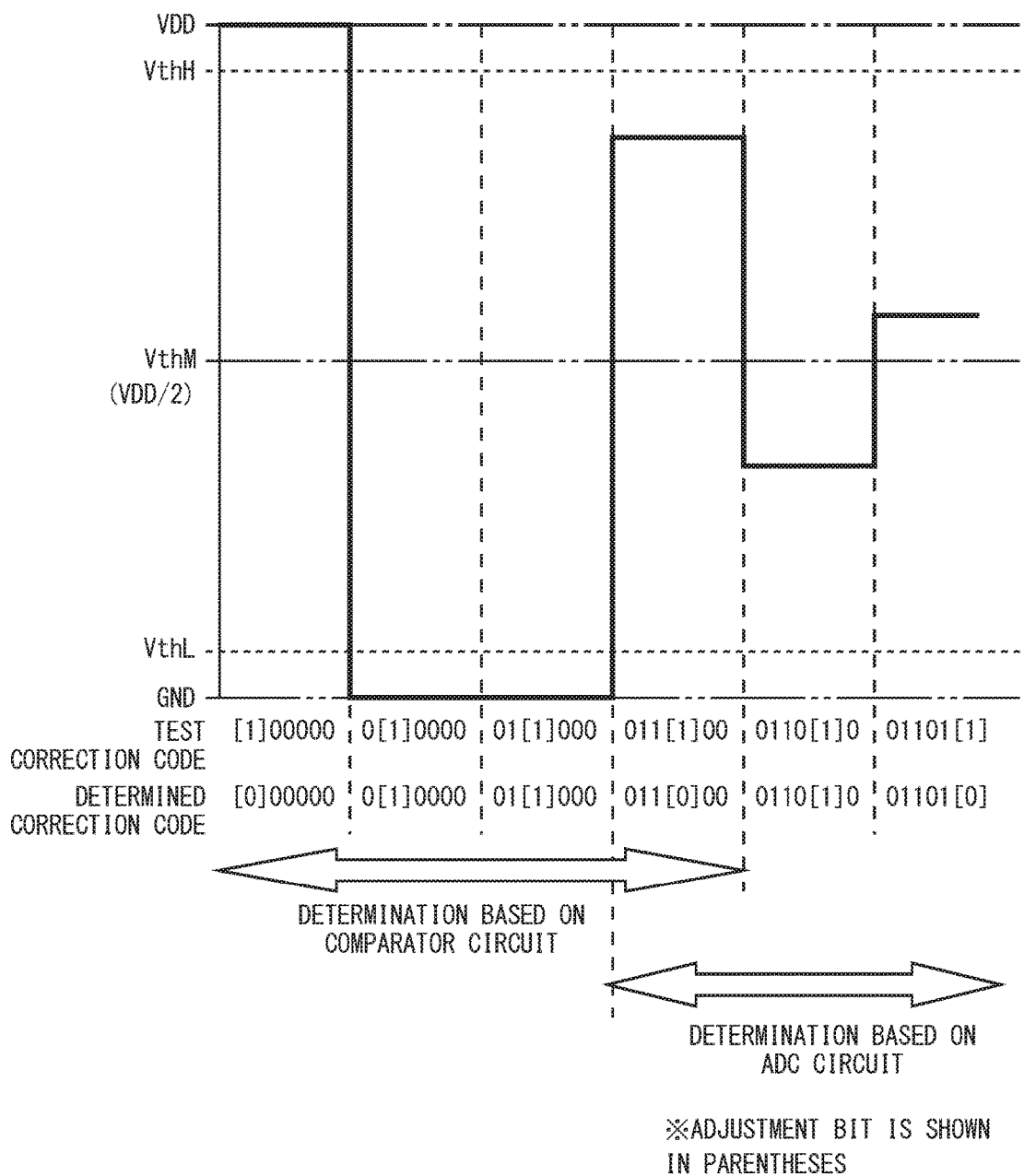
FIG. 4 is a timing chart showing a specific example of the offset voltage correction processing in the semiconductor device according to the first embodiment.

Next, operations of the semiconductor device 1 according to the first embodiment will be described with reference to specific examples. FIG. 4 shows a timing chart showing a specific example of the offset voltage correction processing in the semiconductor device according to the first embodiment. In the example shown in FIG. 4, a six-bit value is used as the correction code Sofs.

As shown in FIG. 4, in the semiconductor device 1 according to the first embodiment, first, the most significant bit of the correction code Sofs is selected as an adjustment bit b[6] and "1" is set as the value of the adjustment bit b[6]. According "100000" is supplied to the operational amplifier 10 as the correction code Sofs. In the example shown in FIG. 4, the operational amplifier 10 to which "100000" is supplied as the correction code Sofs outputs a signal which substantially serves as the power supply voltage as the output signal Aout. Accordingly, the semiconductor device 1 according to the first embodiment sets the value of the adjustment bit b[6] to "0" based on the processes of Steps S14 to S16 shown in FIG. 3.

Next, the semiconductor device 1 according to the first embodiment selects the correction code in the fifth bit of the correction code Sofs as an adjustment bit b[5] and sets "1" as the value of tub adjustment bit b[5]. Accordingly, "010000" is supplied to the operational amplifier 10 as the correction code Sofs. In the example shown in FIG. 4, the operational amplifier 10 to which "010000" is supplied as the correction code Sofs outputs the signal which substantially serves as the ground voltage as the output signal Aout. Accordingly, the semiconductor device 1 according to the first embodiment sets the value or the adjustment bit b[5] to "1" based on the processes in Steps S14 and S15 in FIG. 3.

Next, the semiconductor device 1 according to the first embodiment selects the correction code in the fourth bit of the correction code Sofs as an adjustment bit b[4] and "1" is set as the value of the adjustment bit b[4]. Accordingly, "011000" is supplied to the operational amplifier 10 as the correction code Sofs. In the example shown in FIG. 4, the operational amplifier 10 to which "011000" is supplied as the correction code Sofs outputs the signal which substantially serves as the ground voltage as the output signal Aout. Accordingly, the semiconductor device 1 according to the first embodiment sets the value or the adjustment bit b[4] to "1" based on the processes in Steps S14 and S15 in FIG. 3.

Next, the semiconductor device 1 according to the first embodiment selects the correction code in the third bit of the correction code Sofs as an adjustment bit b[3] and sets "1" as the value of the adjustment bit b[3]. Accordingly, "011100" is supplied to the operational amplifier 10 as the correction code Sofs. In the example shown in FIG. 4, the operational amplifier 10 to which "011100" is supplied as the correction code Sofs outputs the signal within the fine adjustment range as the output signal Aout. Accordingly, the semiconductor device 1 according to the first embodiment switches the circuit that outputs the output determination value to the offset controller 18 based on the process in Step S14 in FIG. 3 from the comparator circuits 15 and 16 to the analog-to-digital conversion circuit 17. Then, the semiconductor device 1 according to the first embodiment determines that the signal level of the output signal Aout is equal to or larger than that of the reference voltage VthM based on the digital code Do output from the analog-to-digital conversion circuit 17 and sets the value of the adjustment bit b[3] to "0".

Next, the semiconductor device 1 according to the first embodiment selects the correction code in the second bit of the correction code Sofs as an adjustment bit b[2] and sets "1" as the value of the adjustment bit b[2]. Accordingly, "011010" is supplied to the operational amplifier 10 as the correction code Sofs. In the example shown in FIG. 4, the operational amplifier 10 to which "011010" is supplied as the correction code Sofs outputs the signal within the fine adjustment range as the output signal Aout. Then, the semiconductor device 1 according to the first embodiment determines that the signal level of the output signal Aout is equal to or lower than that of the reference voltage VthM based on the digital code Do output from the analog-to-digital conversion circuit 17 and sets the value of the adjustment bit b[2] to "1".

Next, the semiconductor device 1 according to the first embodiment sets the correction code in the first bit of the correction code Sofs as an adjustment bit b[1] and sets "1" as the value of the adjustment bit b[1]. Accordingly, "011011" is supplied to the operational amplifier 10 as the correction code Sofs. In the example shown in FIG. 4, the operational amplifier 10 to which "011011" has been given as the correction code Sofs outputs the signal within the fine adjustment range as the output signal Aout. Then the semiconductor device 1 according to the first embodiment determines that the signal level of the output signal Aout is equal to or larger than that of the reference voltage VthM based on the digital code Do output from the analog-to-digital conversion circuit 17 and sets the value of the adjustment bit b[1] to "0".

According to the above processing, in the example shown in FIG. 4, the semiconductor device 1 according to the first embodiment determines "011010" as the final correction code Sofs.

From the aforementioned description, the semiconductor device 1 according to the first embodiment calculates the value of the bit of the correction code Sofs based on the output determination values output from the comparator circuits 15 and 16 in the period during which the voltage level of the output signal Aout of the operational amplifier 10 is outside of the fine adjustment range. On the other hand, if the voltage level of the output signal Aout is determined using the analog-to-digital conversion circuit 17 even in the period during which the voltage level of the output signal Aout of the operational amplifier 10 is outside of the fine adjustment range, time is required for conducting binary research of the analog-to-digital conversion circuit 17 and it thus takes much time to calculate the correction code Sofs. That is, the semiconductor device 1 according to the first embodiment calculates the correction code Sofs based on the output determination values output from the comparator circuits 15 and 16 in the period during which the voltage level of the output signal Aout of the operational amplifier 10 is outside of the fine adjustment range, whereby it is possible to reduce the time required to determine the value of the correction code Sofs.

Further, after the adjustment of the correction code Sofs proceeds to such a degree that the voltage level of the output signal Aout of the operational amplifier 10 falls within the fine adjustment range, the semiconductor device 1 according to the first embodiment calculates the value of the bit of the correction code Sofs based on the output determination value output from the analog-to-digital conversion circuit 17. The semiconductor device 1 according to the first embodiment is therefore able to reduce the input offset of the operational amplifier 10 to such a degree that the adjustment becomes difficult due to the influence of the dead zone generated in the comparator circuit or the like.

That is, the semiconductor device 1 according to the first embodiment is able to reduce the time required to calculate the correction code Sofs while reducing the input offset of the operational amplifier 10 without being influenced by the dead zone generated in the comparator circuit or the like.

Second Embodiment

Figure 5:
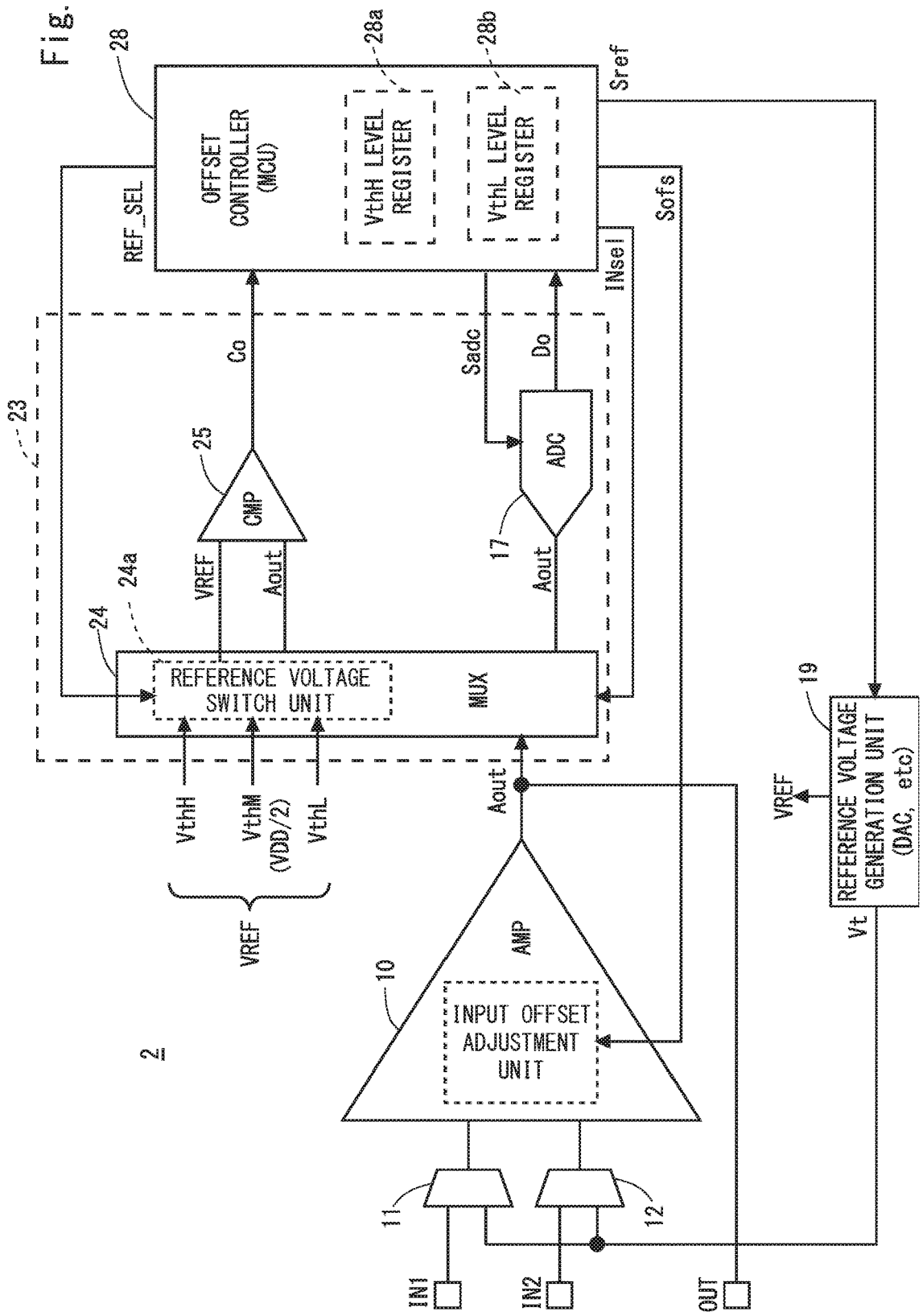
FIG. 5 is a block diagram of a semiconductor device according to a second embodiment.

In a second embodiment, a semiconductor device 2, which is another form of the semiconductor device 1 according to the first embodiment, will be described. FIG. 5 shows a block diagram of the semiconductor device 2 according to the second embodiment.

As shown in FIG. 5, in the semiconductor device 2 according to the second embodiment, the output determination unit 13 and the offset controller 18 of the semiconductor device 1 according to the first embodiment are replaced by an output determination unit 23 and an offset controller 28.

The output determination unit 23 includes a multiplexer 24, a comparator circuit 25, and an analog-to-digital conversion circuit 17. Further, while the function of the multiplexer 24 is the same as that of the multiplexer 14 according to the first embodiment, the multiplexer 24 includes a reference voltage switch unit 24a that performs an operation different from that of the reference voltage switch unit 14a according to the first embodiment. The reference voltage switch unit 24a receives a first reference voltage (e.g., reference voltage VthM), second reference voltage (e.g., reference voltage VthH) having a voltage value higher than that of the reference voltage VthM, and a third reference voltage (e.g., reference voltage VthL) having a voltage value lower than that of the reference voltage VthM and switches the reference voltage to be output based on a reference voltage selection signal REF_SEL output from the operation unit (e.g., offset controller 28).

The comparator circuit 25 switches the logic level of the output value Co based on the respective magnitudes of the reference voltage VREF output from the reference voltage switch unit 24a and the output signal Aout of the operational amplifier 10. The output determination value output from the output determination unit 23 includes the output value Co output from the comparator circuit 25 and the digital code Do output from the analog-to-digital conversion circuit 17.

The offset controller 28 is obtained by adding the function of outputting the reference voltage selection signal REF_SEL to the offset controller 18 according to the first embodiment. The offset controller 28 performs reference voltage determination processing that determines the logic level of the output value of the comparator circuit 25 in a state in which it is instructing the reference voltage switch unit 24a to output the reference voltage VthM to the comparator circuit 25. When it is determined in the reference voltage determination processing that the output value Co of the comparator circuit 25 indicates the first logic level, the offset controller 28 outputs the reference voltage selection signal REF_SEL that instructs to switch the reference voltage to be output from the reference voltage switch unit 24a to the comparator circuit 25 from the reference voltage VthM to the reference voltage VthH. Further, when it is determined in the reference voltage determination processing that the output value Co of the comparator circuit 25 indicates the second logic level, the offset controller 28 outputs the reference voltage selection signal REF_SEL that instructs to switch the reference voltage to be output from the reference voltage switch unit 24a to the comparator circuit 25 from the reference voltage VthM to the reference voltage VthL.

Further, the method of determining the voltage level of the output signal Aout based on the output determination value output from the comparator circuit in the offset controller 28 is different from that in the offset controller 18 according to the first embodiment. The offset controller 28 holds the output value Co output from the comparator circuit 25 as the value corresponding to the output value Co1 output from the comparator circuit 15 in a state in which the reference voltage switch unit 24a is outputting the reference voltage VthM. Then the offset controller 28 receives the output value Co output from the comparator circuit 25 as the output value Co2 output from the comparator circuit 16 in a state in which the reference voltage switch un 24a is outputting the reference voltage VthH or the reference voltage VthL. According to such an operation, the offset controller 28 determines the voltage level of the output signal Aout in a way similar to the determination performed in the offset controller 18 based on the output value Co output from the comparator circuit 25.

From the aforementioned description, in the semiconductor device 2 according to the second embodiment, the number of comparator circuits is reduced, whereby it is possible to reduce the input offset of the operational amplifier 10 to such a degree that the adjustment becomes difficult due to the influence of the dead zone that is generated in the comparator circuit or the like, similar to the semiconductor device 1 according to the first embodiment while further reducing the circuit area compared to that in the semiconductor device 1 according to the first embodiment.

Third Embodiment

Figure 6:
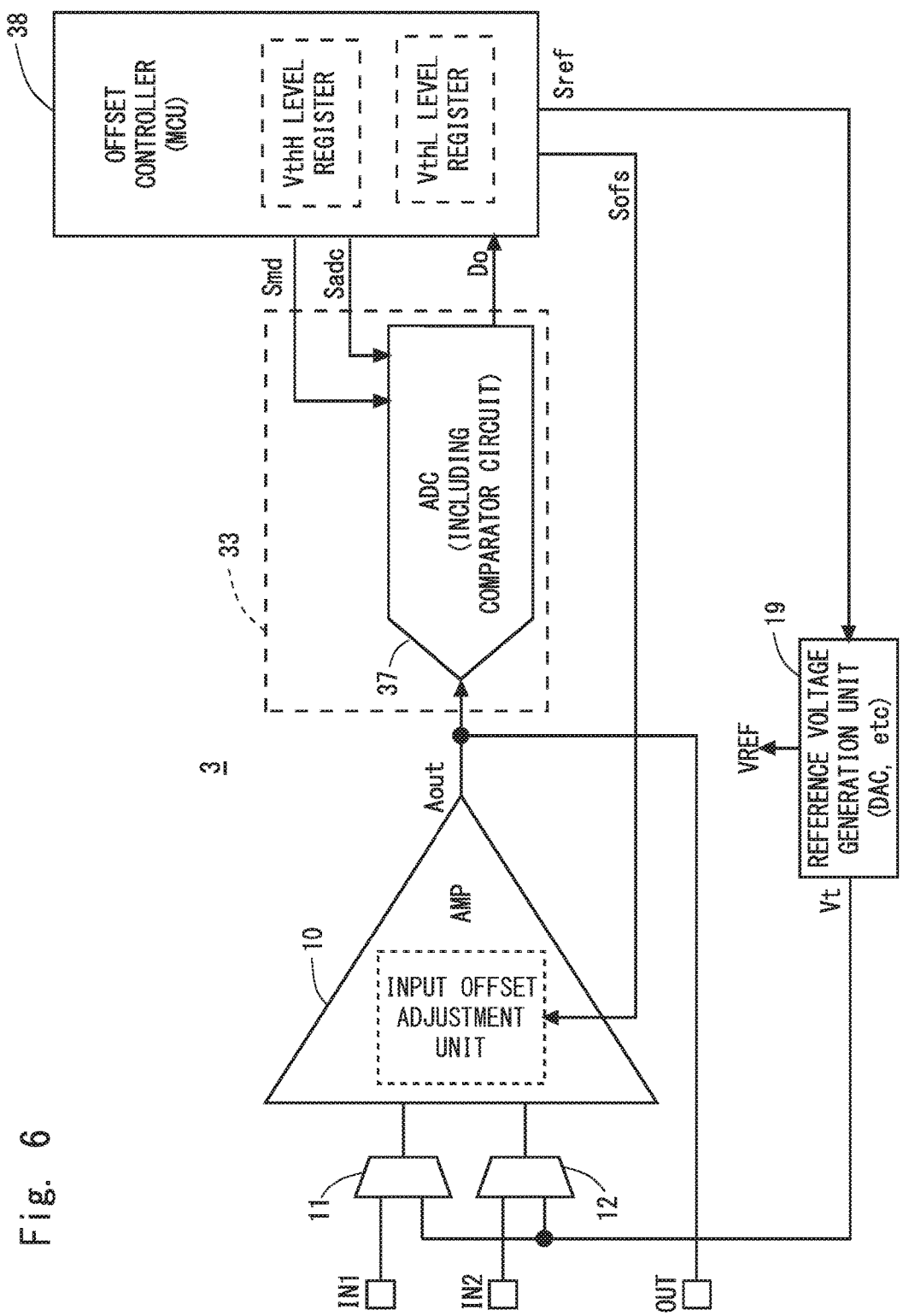
FIG. 6 is a block diagram of a semiconductor device according to a third embodiment.

In a third embodiment, a semiconductor device 3 which is another form of the semiconductor device 1 according to the first embodiment, will be described. FIG. 6 shows a block diagram of the semiconductor device 3 according to the third embodiment.

As shown in FIG. 6, the semiconductor device 3 according to the third embodiment includes an output determination unit 33 and an offset controller 38 in place of the output determination unit 13 and the offset controller 18 in the semiconductor device 1 according to the first embodiment.

The output determination unit 33 includes an analog-to-digital conversion circuit 37. The analog-to-digital conversion circuit 37 is a successive approximation analog-to-digital conversion circuit that includes a comparator circuit. In the semiconductor device 3 according to the third embodiment, the comparator circuit included in the analog-to-digital conversion circuit 37 is used as the comparator circuit 15 and the comparator circuit 16 according to the first embodiment. Further, in the semiconductor device 3 according to the third embodiment, a control block and a digital-to-analog conversion circuit included in the analog-to-digital conversion circuit 37 are used as the reference voltage switch unit 24a.

The offset controller 38 is obtained by adding a function of outputting an operation mode switch signal Smd that switches the operation mode of the analog-to-digital conversion circuit 37 to the offset controller 18 according to the first embodiment. When the analog-to-digital conversion circuit 37 is used as a comparator circuit, the offset controller 38 determines the voltage level of the output signal Aout using only a part of the bits (e.g., one bit) of the digital code Do output from the analog-to-digital conversion circuit 37.

Figure 7:
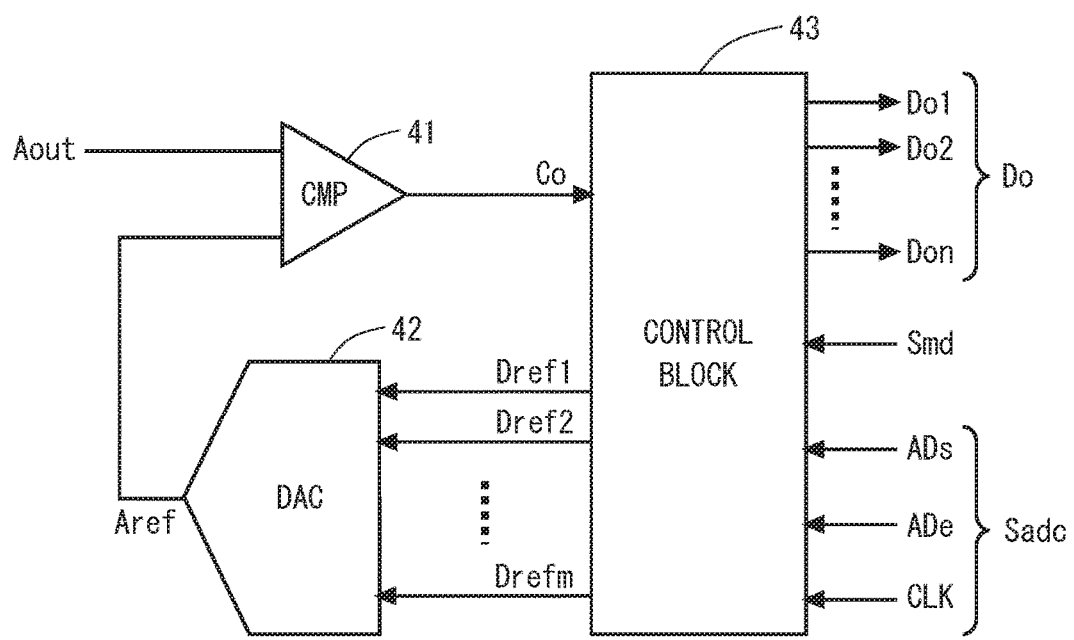
FIG. 7 is a block diagram of an analog-to-digital conversion circuit of the semiconductor device according to the third embodiment.

The details of the analog-to-digital conversion circuit 37 will be described. FIG. 7 shows a block diagram of an analog-to-digital conversion circuit of the semiconductor device according to the third embodiment. As shown in FIG. 7, the analog-to-digital conversion circuit 37 includes a comparator circuit 41, a digital-to-analog conversion circuit 42, and a control block 43.

The comparator circuit 41 switches the logic level of the output value Co based on the respective magnitudes of the output signal Aout and a reference voltage for comparison Aref output from the digital-to-analog conversion circuit 42. The digital-to-analog conversion circuit 42 outputs the reference voltage for comparison Aref having the voltage value corresponding to the value shown by m-bit voltage instruction codes (Dref1 to Drefm in FIG. 6). The control block 43 outputs the digital code Do according to the output of the comparator circuit 41. Further, the control block 43 controls the comparator circuit 41 and the digital-to-analog conversion circuit 42 based on a conversion processing start signal ADs, a conversion processing end signal ADe, and a clock signal CLK included in the ADC control signal Sadc. Further, the control block 43 changes the voltage instruction code Dref based on the logic level of the output value Co of the comparator circuit 41.

The control block 43 receives the operation mode switch signal Smd. When the operation mode switch signal Smd indicates a comparator mode, the control block 43 selects one of the values that corresponds to the reference voltage VthM, or VthH or VthL as the voltage instruction code to output the selected value. Specifically, when the operation mode switch signal Smd indicates the comparator mode, the control block 43 first outputs the value corresponding to the reference voltage VthM as the voltage instruction code Dref. Then the digital-to-analog conversion circuit 42 outputs the reference voltage VthM as the reference voltage for comparison Aref and the comparator circuit 41 outputs the output value Co based on the respective magnitudes of the reference voltage VthM and the output signal Aout. The control block 43 allocates the output value Co obtained corresponding to the reference voltage VthM to a predetermined bit (e.g., most significant bit) in the digital code Do and outputs the allocated value and changes the value of the voltage instruction code Dref to a value corresponding to the reference voltage VthH or the reference voltage VthL in accordance with the logic level of the output value Co. Then the digital-to-analog conversion circuit 42 outputs the reference voltage VthH or the reference voltage VthL as the reference voltage for comparison Aref and the comparator circuit 41 outputs the output value based on the respective magnitudes of the reference voltage VthH or the reference voltage VthL and the output signal Aout. The control block 43 allocates the output value Co obtained corresponding to the reference voltage VthH or the reference voltage VthL to a predetermined bit in the digital code Do most (e.g., most significant bit) and outputs the allocated value.

Further, when the operation mode switch signal Smd indicates the ADC mode, the control block 43 controls the analog-to-digital conversion circuit 37 as a successive approximation analog-to-digital conversion circuit. Specifically, in the ADC mode, the control block 43 acquires the output value Co of the comparator circuit 41 while increasing or decreasing the value of the voltage instruction code Dref in accordance with the logic level of the output value Co of the comparator circuit 41. In the analog-to-digital conversion circuit 37, a process of obtaining one output value Co in accordance with one reference voltage for comparison Aref is set to be one conversion cycle. The control block 43 repeats the conversion cycle a number of times corresponding to the bit number of the digital code Do.

The offset controller 38 performs the following operation based on the output determination value output from the output determination unit 33. The offset controller 38 calculates the correction code Sofs based on the value of the most significant bit of the digital code Do output from the analog-to-digital conversion circuit 37 in the period during which the voltage level of the output signal Aout of the operational amplifier 10 is outside of the fine adjustment range. Further, the offset controller 38 calculates the correction code Sofs based on the values of all the bits of the digital code Do output from the analog-to-digital conversion circuit 37 in the period during which the voltage level of the output signal of the operational amplifier 10 is within the fine adjustment range.

From the aforementioned description, in the semiconductor device 3 according to the third embodiment, the number of comparator circuits is reduced, whereby it is possible to reduce the input offset of the operational amplifier 10 to such a degree that the adjustment becomes difficult due to the influence of the dead zone that is generated in the comparator circuit or the like, similar to the semiconductor device 1 according to the first embodiment while further reducing the circuit area compared to that in the semiconductor device 1 according to the first embodiment.

Fourth Embodiment

Figure 8:
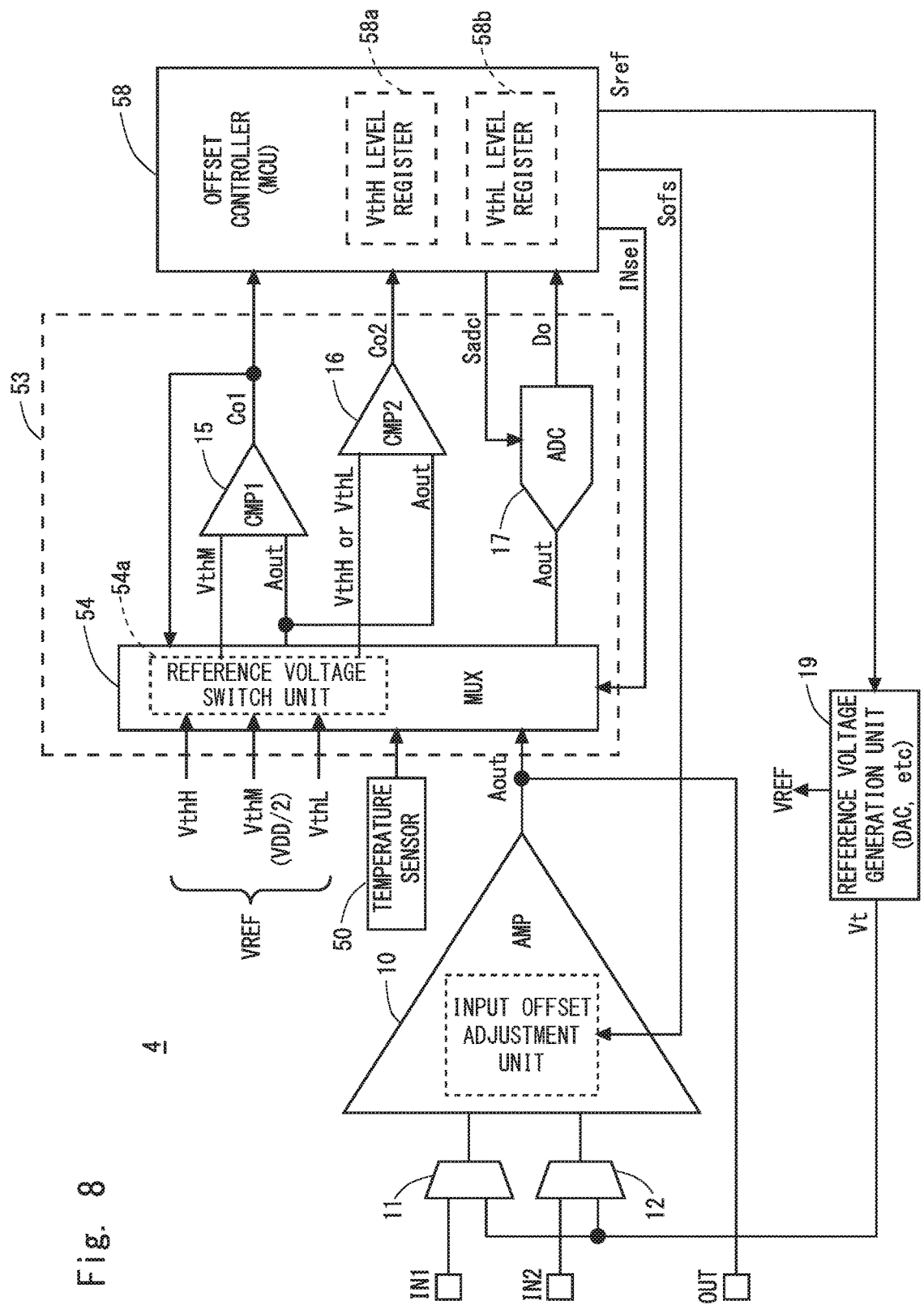
FIG. 8 is a block diagram of a semiconductor device according to a fourth embodiment.

In a fourth embodiment, a semiconductor device 4, which is another form of the semiconductor device 1 according to the first embodiment, will be described. FIG. 8 shows a block diagram of the semiconductor device according to the fourth embodiment. The semiconductor device 4 according to the fourth embodiment is obtained by adding processing using temperature information acquired by a temperature sensor 50 to the semiconductor device 1 according to the first embodiment. Specifically, the semiconductor (device 4 according to the fourth embodiment performs offset voltage adjustment processing (offset drift correction processing) on the operational amplifier 10 based on a change in the ambient temperature of the semiconductor device 4 based on the temperature information acquired from the temperature sensor 50. The temperature sensor 50 is a sensor that measures the ambient temperature of the semiconductor device 4. The temperature sensor 50 may be formed on a semiconductor chip on which the semiconductor device 4 is formed or may provided separately from the semiconductor device 4.

As shown in FIG. 8, the semiconductor device 4 according to the fourth embodiment includes an output determination unit 53 and an offset controller 58 in place of the output determination unit 13 and the offset controller 18 according to the first embodiment. The output determination unit 53 includes a multiplexer 54 in place of the multiplexer 14 according to the first embodiment. A reference voltage switch unit 54a in the multiplexer 54 is the same as the reference voltage switch unit 14a according to the first embodiment. The multiplexer 54 is obtained by adding a function of outputting the temperature information output from the temperature sensor 50 in a period during which the offset voltage correction processing described in FIGS. 2 and 3 is not being executed to the analog-to-digital conversion circuit 17 to the multiplexer 14.

The offset controller 58 is obtained by adding a function of executing the offset drift correction processing to the offset controller 18. The offset controller 58 acquires temperature data generated by the analog-to-digital conversion circuit 17 from the temperature information. When the temperature data exceeds an allowable range that has been set in advance, the offset controller 58 re-calculates the value of the correction code Sofs. This re-calculation processing of the correction data is the offset drift correction processing.

Figure 9:
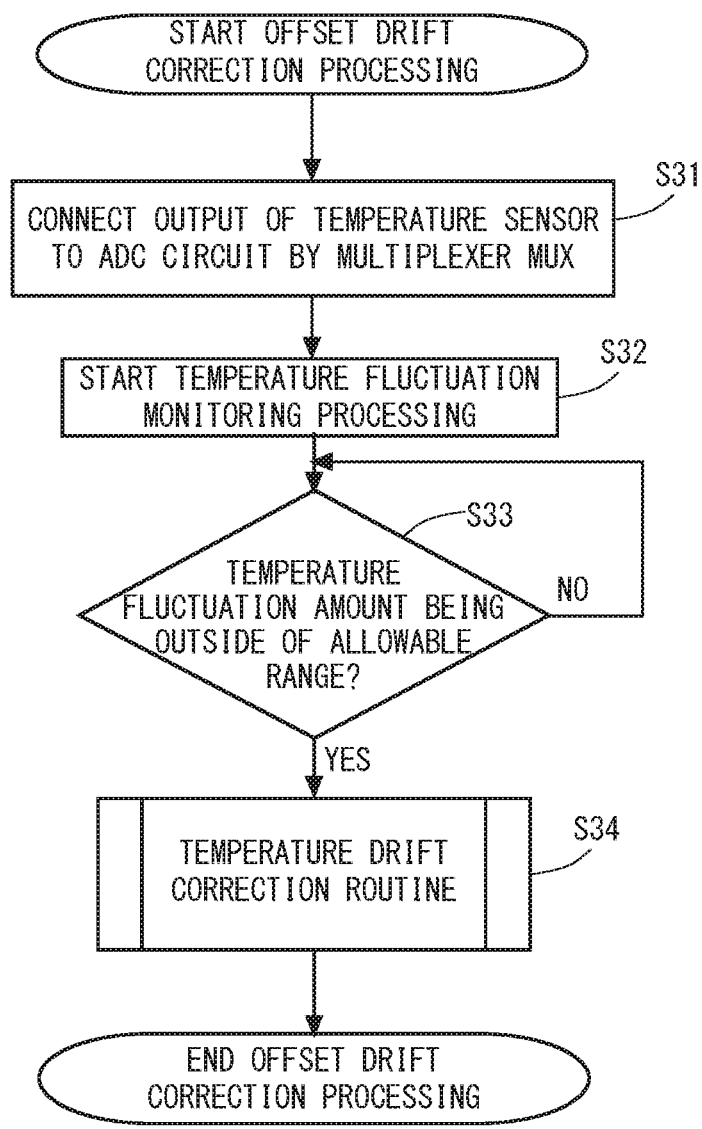
FIG. 9 is a flowchart showing a procedure of offset drift correction processing in the semiconductor device according to the fourth embodiment.
Figure 10:
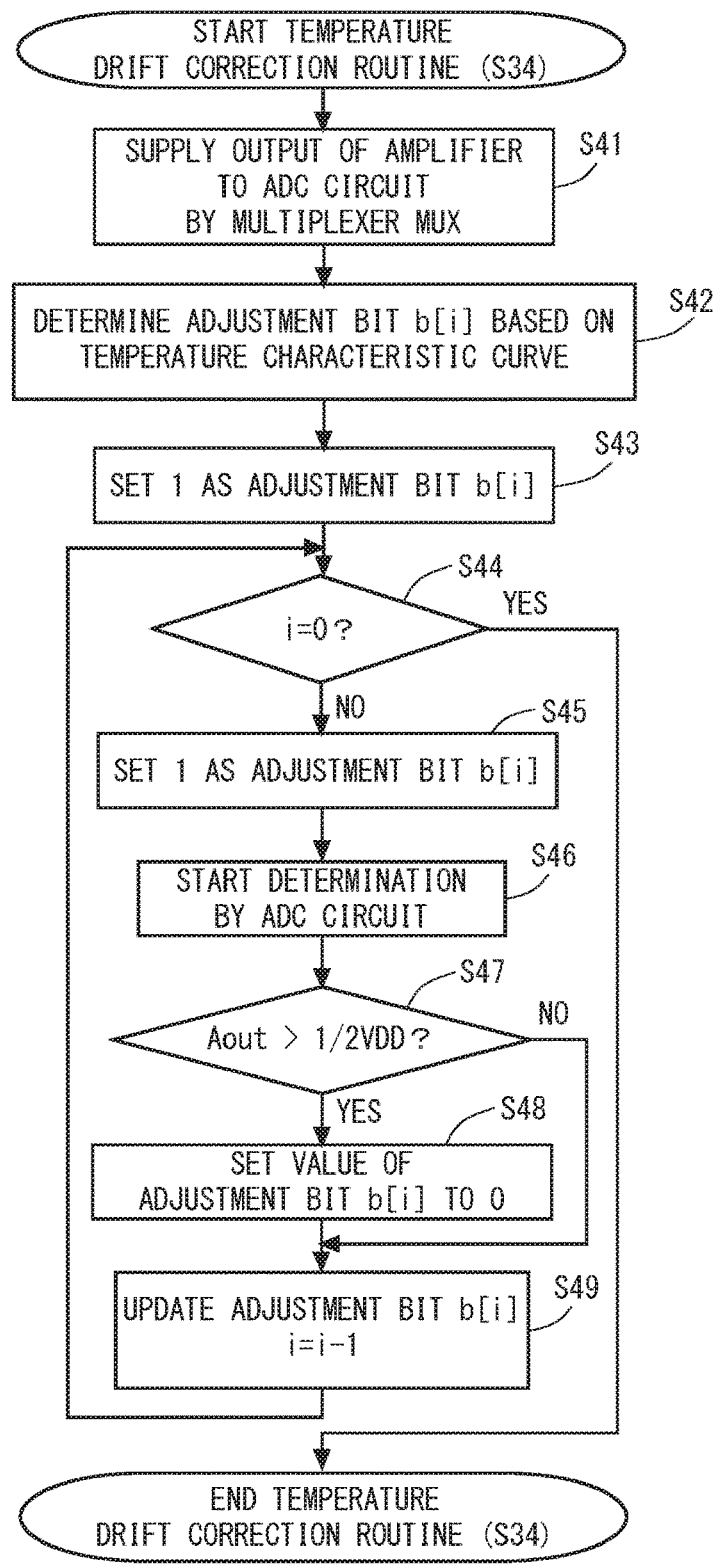
FIG. 10 is a flowchart showing a procedure of a temperature drift correction routine in the flowchart shown in FIG. 9.

With reference next to FIGS. 9 and 10, the offset drift correction processing performed in the semiconductor device 4 according to the fourth embodiment will be described. FIG. 9 shows a flowchart showing a procedure of the offset drift correction processing in the semiconductor device 4 according to the fourth embodiment.

As shown in 9, when the offset drift correction processing is started, in the semiconductor device 4 according to the fourth embodiment, the multiplexer 54 first transmits the temperature information output from the temperature sensor 50 to the analog-to-digital conversion circuit 17 (Step S31). After that, the semiconductor device 4 according to the fourth embodiment starts temperature fluctuation monitoring processing (Step S32). Then, the semiconductor device 4 according to the fourth embodiment continues temperature fluctuation monitoring until the time that the temperature fluctuation amount from the time the offset voltage correction processing has been executed last time becomes outside of the allowable range based on the temperature information obtained from the temperature sensor 50 (Step S33). Then the semiconductor device 4 executes the temperature drift correction routine in accordance with the fact that the temperature fluctuation amount has exceeded the allowable range (Step S34).

FIG. 10 shows a flowchart showing a procedure of the temperature drift correction routine in the flowchart shown in FIG. 9. As shown in FIG. 10, in the temperature drift correction routine, the semiconductor device 4 according to the fourth embodiment first supplies the output signal Aout of the operational amplifier 10 to the analog-to-digital conversion circuit 17 by the multiplexer 54 (Step S41). In Step S41, the input terminals of the operational amplifier 10 are short-circuited and the test voltage Vt is supplied to the input terminals. Further, the semiconductor device 4 according to the fourth embodiment determines the adjustment bit b[i] based on a temperature characteristic curve that has been measured in advance (Step S42).

Next, the semiconductor device 4 according to the fourth embodiment sets "1" as the value of the adjustment bit b[i] determined in Step S42 (Step S43). After that, the semiconductor device 4 according to the fourth embodiment determines whether the bit number i of the adjustment bit is "0" (Step S44). When it is determined in the determination processing of Step S44 that the bit number i is "0", the semiconductor device 4 according to the fourth embodiment completes the temperature drift correction routine and the offset drift correction processing. On the other hand, when it is determined in the determination processing of Step S44 that the bit number i is a value other than "0", semiconductor device 4 according to the fourth embodiment sets "1" as the value of the adjustment bit b[i] (Step S45). After that, the semiconductor device 4 according to the fourth embodiment starts processing of determining the voltage level of the output signal Aout based on the output correction value (e.g., digital code Do) output from the analog-to-digital conversion circuit 17 (Step S46).

In this determination processing, it is determined whether the voltage level of the output signal Aout is higher than that of the reference voltage VthM (=VDD/2) (Step S47). When it is determined in Step S47 that the voltage level of the output signal Aout is higher than that of the reference voltage VthM, the semiconductor device 4 according to the fourth embodiment sets the value of the adjustment bit b[i] to "0" (Step S48). On the other hand, when it is determined in Step S47 that the voltage level of the output signal Aout is equal to or lower than that of the reference voltage VthM, the semiconductor device 4 according to the fourth embodiment keeps the value of the adjustment bit b[i] to "1". After that, the semiconductor device 4 according to the fourth embodiment decrements the bit to be selected as the adjustment bit by one and updates the adjustment bit b[i] (Step S49). After the update processing in Step S49 is completed, the processes from Steps S44 to S49 are repeated.

From the aforementioned description, in the semiconductor device 4 according to the fourth embodiment, the offset drift correction processing that corrects the offset again is executed when the temperature fluctuation amount from the ambient temperature when the offset voltage correction processing is executed last time has exceeded the allowable range that has been set in advance based on the temperature information acquired from the temperature sensor 50. Accordingly, even when the magnitude of the input offset is changed due to the change in the ambient temperature, the semiconductor device 4 according to the fourth embodiment is able to keep the input offset small. It is generally known that the input offset varies depending on the temperature and the effect of executing the offset correction processing again in accordance with the change in the ambient temperature is large.

Further, the semiconductor device 4 according to the fourth embodiment performs only the correction processing based on the output determination value output from the analog-to-digital conversion circuit 17 in the offset correction processing (e.g., temperature drift correction routine in FIG. 10) executed in the offset drift correction processing. Accordingly, the semiconductor device 4 according to the fourth embodiment is able to reduce the number of bits of the correction code to be calculated and to reduce the time required for the correction processing.

Fifth Embodiment

In a fifth embodiment, a semiconductor device 5, which is another form of the semiconductor device 1 according to the first embodiment, will be described. FIG. 11 is a block diagram of the semiconductor device according to the fifth embodiment. In FIG. 11, the reference voltages VthH, VthM, and VthL included in the reference voltage VREF are not shown.

As shown in FIG. 11, the semiconductor device 5 according to the fifth embodiment includes a plurality of operational amplifiers (operational amplifiers 101 to 10k in FIG. 11: k is an integer indicating the number of operational amplifiers 10). Further, the semiconductor device 5 according to the fifth embodiment includes a multiplexer 61, input selectors 62, an output determination unit 63, an offset controller 66, and a reference voltage generation unit 19.

The multiplexer 61 switches to which one of the operational amplifiers 101 to 10k each of k pairs of input terminals should be connected. The input selectors 62 include a plurality of selectors that switch whether to supply the input signal input from outside or to supply the test voltage Vt to the inputs of the respective operational amplifiers 101 to 10k. All the lines that transmit the test voltage Vt are short-circuited.

The output determination unit 63 determines the voltage level of the output signal Aout of an operational amplifier selected from the operational amplifiers 101 to 10k and outputs the result of the determination to the offset controller 66 as the output determination value. The output determination unit 63 includes a multiplexer 64 and an amplifier voltage determination unit 65.

The multiplexer 64 selects the output signal Aout of one of the plurality of operational amplifiers based on an instruction from the operation unit (e.g., offset controller 66) and assigns the output signal Aout of the operational amplifier that has been selected to the comparator circuit and the analog-to-digital conversion circuit. The multiplexer 64 includes the comparator circuit and the analog-to-digital conversion circuit included in the output determination unit described in the aforementioned embodiment.

The offset controller 66 is substantially the same as the offset controller 18 except that the determination circuit selection signal INsel output from the offset controller 66 includes information that causes the multiplexer 64 to select the input signal.

In the semiconductor device 5 according to the fifth embodiment, while the offset voltage correction processing described in FIGS. 2 and 3 is being executed for one of the operational amplifiers 101 to 10k, the other operational amplifiers are normally operated. That is, in the semiconductor device 5 according to the fifth embodiment, even in the period during which the offset voltage correction processing is executed for one operational amplifier, the other operational amplifiers can be normally used.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

The first to fifth embodiments can be combined as desirable by one of ordinary skill in the art.

What is claimed is:

1. A semiconductor device comprising:
   an operational amplifier comprising an offset adjustment function that mitigates an influence of an input offset based on a multi-bit correction code and an amplification function that amplifies an input signal and outputs the amplified signal;
   an output determination unit that outputs a digital value in accordance with a magnitude of a voltage level of an output signal of the operational amplifier as an output determination value; and
   an operation unit that calculates the multi-bit correction code based on the output determination value, wherein:
   the operation unit calculates, when the voltage level of the output signal of the operational amplifier is outside of a fine adjustment range that is set in advance, the multi-bit correction code based on the number of bits smaller than that in a case in which the voltage level of the output signal of the operational amplifier is within the fine adjustment range.

2. The semiconductor device according to claim 1, wherein:
   the output determination unit comprises:
   a comparator circuit that switches the logic level of the output determination value based on a comparison of magnitudes of the output signal of the operational amplifier and the reference voltage; and
   an analog-to-digital conversion circuit that outputs a digital code indicating a value corresponding to the voltage level of the output signal of the operational amplifier as the output determination value in a number of bits larger than that of the output determination value output from the comparator circuit,
   the operation unit calculates, when the voltage level of the output signal of the operational amplifier is outside of the fine adjustment range, the multi-bit correction code based on the output determination value output from the comparator circuit, and
   the operation unit calculates, when the voltage level of the output signal of the operational amplifier is within the fine adjustment range, the multi-bit correction code based on the output determination value output from the analog-to-digital conversion circuit.

3. The semiconductor device according to claim 2, wherein the output determination unit comprises a multiplexer that assigns the output signal of the operational amplifier to the comparator circuit and the analog-to-digital conversion circuit.

4. The semiconductor device according to claim 3, wherein:
   the comparator circuit comprises a first comparator circuit and a second comparator circuit,
   the multiplexer comprises a reference voltage switch unit that receives a first reference voltage, a second reference voltage having a voltage value higher than that of the first reference voltage, and a third reference voltage having a voltage value lower than that of the first reference voltage, and switches a reference voltage to be output to the second comparator circuit based on the output value of the first comparator circuit,
   the reference voltage switch unit outputs the first reference voltage to the first comparator circuit, and
   the reference voltage switch unit outputs the second reference voltage to the second comparator circuit when the output value of the first comparator circuit indicates a first logic level and outputs the third reference voltage to the second comparator circuit when the output value of the first comparator circuit indicates a second logic level.

5. The semiconductor device according to claim 3, wherein:
   the multiplexer comprises a reference voltage switch unit that receives a first reference voltage, a second reference voltage having a voltage value higher than that of the first reference voltage, and a third reference voltage having a voltage value lower than that of the first reference voltage, and switches a reference voltage to be output based on a reference voltage selection signal output from the operation unit,
   the operation unit performs reference voltage determination processing that determines a logic level of an output value of the comparator circuit in a state in which an instruction is being given to the reference voltage switch unit to output the first reference voltage to the comparator circuit,
   the operation unit outputs, when it is determined in the reference voltage determination processing that the output value of the comparator circuit indicates a first logic level, a reference voltage selection signal that instructs to switch the reference voltage output from the reference voltage switch unit to the comparator circuit from the first reference voltage to the second reference voltage, and
   the operation unit outputs, when it is determined in the reference voltage determination processing that the output value of the comparator circuit indicates a second logic level, a reference voltage selection signal that instructs to switch the reference voltage output from the reference voltage switch unit to the comparator circuit from the first reference voltage to the third reference voltage.

6. The semiconductor device according to claim 2, wherein:

the analog-to-digital conversion circuit is a successive approximation analog-to-digital conversion circuit including the comparator circuit, the operation unit calculates the multi-bit correction code based on a value of a predetermined bit in the digital code output from the analog-to-digital conversion circuit in a period during which the voltage level of the output signal of the operational amplifier is outside of the fine adjustment range, and the operation unit calculates the multi-bit correction code based on a value of all bits of the digital code output from the analog-to-digital conversion circuit in a period during which the voltage level of the output signal of the operational amplifier is within the fine adjustment range.

7. The semiconductor device according to claim 1, wherein:

the output determination unit outputs temperature data generated based on temperature information input from a temperature sensor that measures ambient temperature of the operational amplifier, and the operation unit re-calculates the value of the multi-bit correction code when the temperature data exceeds an allowable range that has been set in advance.

8. The semiconductor device according to claim 3, wherein:

the semiconductor device comprises a plurality of operational amplifiers, and the multiplexer selects an output signal of one of the plurality of operational amplifiers based on an instruction from the operation unit and assigns the output signal of the operational amplifier that has been selected to the comparator circuit and the analog-to-digital conversion circuit.

9. The semiconductor device according to claim 1, comprising:

a first register that sets an upper-limit voltage level of the fine adjustment range;

a second register that sets a lower-limit voltage level of the fine adjustment range; and a reference voltage generation unit that outputs an upper-limit reference voltage in accordance with the upper-limit voltage level set in the first register and a lower-limit reference value in accordance with the lower-limit voltage level set in the second register, wherein the output determination unit outputs, when the voltage level of the output signal of the operational amplifier is outside of the fine adjustment range that has been set in advance, information indicating whether the voltage level of the output signal of the operational amplifier is between the upper-limit reference voltage and the lower-limit reference voltage as the output determination value.

10. A semiconductor device comprising:

an operational amplifier comprising an offset adjustment function that mitigates an influence of an input offset based on a multi-bit correction code and an amplification function that amplifies an input signal and outputs the amplified signal;

a comparator circuit that switches a logic level of a first output determination value based on a comparison of magnitudes of an output signal of the operational amplifier and a reference voltage;

an analog-to-digital conversion circuit that outputs a digital code indicating a value corresponding to a voltage level of the output signal of the operational amplifier in a number of bits larger than that of the first output determination value as a second output determination value; and an operation unit that calculates the multi-bit correction code based on the first output determination value and the second output determination value, wherein:

the operation unit calculates the multi-bit correction code based on the first output determination value when the voltage level of the output signal of the operational amplifier is outside of a fine adjustment range that has been set in advance, and the operation unit calculates the multi-bit correction code based on the second output determination value when the voltage level of the output signal of the operational amplifier is within the fine adjustment range.

11. The semiconductor device according to claim 10, comprising:

a first register that sets an upper-limit voltage level of the fine adjustment range;

a second register that sets a lower-limit voltage level of the fine adjustment range; and a reference voltage generation unit that outputs an upper-limit reference voltage in accordance with the upper-limit voltage level set in the first register and a lower-limit reference value in accordance with the lower-limit voltage level set in the second register, wherein the comparator circuit outputs, when the voltage level of the output signal of the operational amplifier is outside of the fine adjustment range that has been set in advance, information indicating whether the voltage level of the output signal of the operational amplifier is between the upper-limit reference voltage and the lower-limit reference voltage as the first output determination value.

12. A semiconductor device comprising:

an operational amplifier comprising an offset adjustment function that mitigates an influence of an input offset based on a multi-bit correction code and an amplification function that amplifies an input signal and outputs the amplified signal;

a first register that sets an upper-limit voltage level of a fine adjustment range;

a second register that sets a lower-limit voltage level of the fine adjustment range;

a reference voltage generation unit that outputs an upper-limit reference voltage in accordance with the upper-limit voltage level set in the first register and a lower-limit reference voltage in accordance with the lower-limit voltage level set in the second register;

a comparator circuit that switches a logic level of a first output determination value based on a comparison of magnitudes of an output signal of the operational amplifier and the upper-limit reference voltage and the lower-limit reference voltage;

an analog-to-digital conversion circuit that outputs a digital code indicating a value corresponding to a voltage level of the output signal of the operational amplifier in a number of bits larger than that of the first output determination value as a second output determination value; and an operation unit that calculates the multi-bit correction code based on the first output determination value and the second output determination value, wherein:

the operation unit calculates the multi-bit correction code based on the first output determination value when the voltage level of the output signal of the operational amplifier is outside of the fine adjustment range, and the operation unit calculates the multi-bit correction code based on the second output determination value when the voltage level of the output signal of the operational amplifier is within the fine adjustment range.

* * * * *